United States Patent [19]
Nogaki

[11] Patent Number: 5,512,840
[45] Date of Patent: Apr. 30, 1996

[54] ELECTRICAL TEST CLIPS FOR SLOTTED AND PHILLIPS SCREW HEADS

[76] Inventor: Paul V. Nogaki, 7033 116th Ave. SE., Renton, Wash. 98056

[21] Appl. No.: 188,015

[22] Filed: Jan. 28, 1994

[51] Int. Cl.$^6$ ............................... G01R 1/04; G01R 1/06
[52] U.S. Cl. .......................................... 324/756; 324/72.5
[58] Field of Search ......................... 324/72.5, 756–763; 439/266, 169, 482, 829

[56] References Cited

U.S. PATENT DOCUMENTS 4,491,788  1/1985  Zandonatti ............................ 324/72.5

Primary Examiner—Kenneth A. Wieder
Assistant Examiner—Barry C. Bowser

[57] ABSTRACT

The subject clips are adapted from commercially available screw setters. Shortening of the setters and attachment of electrical conductors converts the setters to electrical test clips.

9 Claims, 1 Drawing Sheet

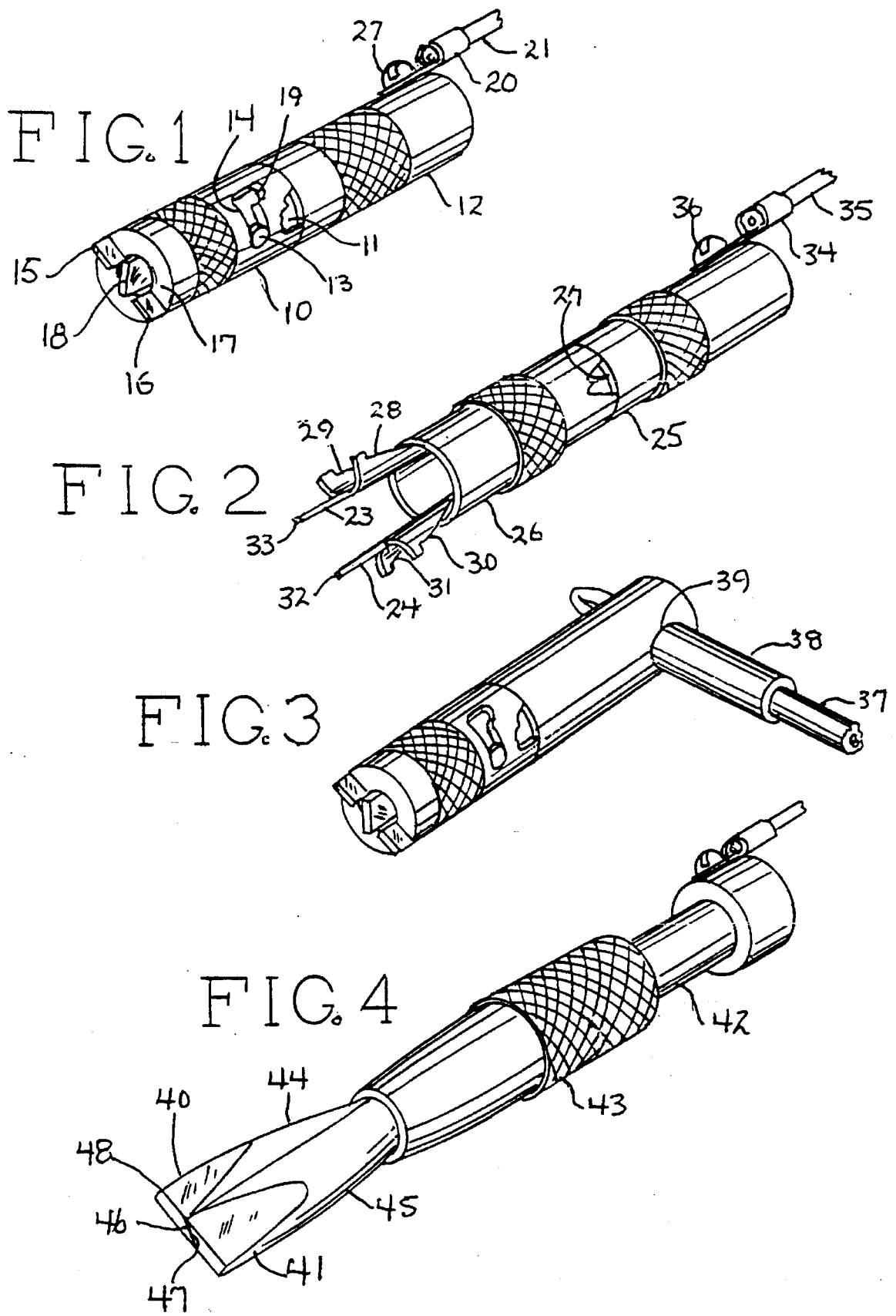

ELECTRICAL TEST CLIPS FOR SLOTTED AND PHILLIPS SCREW HEADS

BACKGROUND OF THE INVENTION

1. Field

The subject invention is in the field of apparatus used for temporarily connecting an electrical lead to a terminal or conductor for electrical test purposes. In particular, it is in the field of such apparatus intended for use on slotted and Phillips™ screw heads.

2. Prior Art

To the best knowledge of the inventor of the subject invention there is no currently commercially available electrical test clip specifically intended for temporary attachment to slotted and Phillips™ screw heads. Clips known in the art as alligator clips serve this purpose if the screw head is high enough to allow secure engagement of the alligator clip but this is often not the case. Accordingly, the prime objective of the subject invention is to provide an electrical test clip which is readily and securely temporarily attachable to slotted head and Phillips™ head screw heads. Other objectives are that the clip be easy to use and acceptably low cost.

SUMMARY OF THE INVENTION

The subject invention is an electrical test clip intended for use on slotted head and Phillips™ head screw heads. The subject clip is adapted from the variety of screw drivers and screw starters, currently commercially available and incorporating a mechanism for engaging the slot or the cavity in a screw head, as distinguished from tools which engage the rims of screw heads. Examples of screw starters are those bearing the trademark TORX™, a trademark of the Camcar Division of Textron, Inc. These starters are marketed under the Craftsman™ trademark registered to Sears, Roebuck and Co. Craftsman™ starter D41024 is for use with slotted screw heads. Craftsman™ starter 9 41025 is for use with Phillips™ heads. The subject invention utilizes the engagement mechanisms of such starters, in as small a unit as feasible, attached to one end of a suitable electrical test conductor. The mechanism for slotted heads has a tip on a short pin similar to the tip of a screw driver; however, the end portions of the tip are rotatable relative to the fixed center portion and spring loaded to rotate. To engage a screw a sleeve on the pin is moved to rotate the rotatable portions to be coplanar with the fixed portion of the tip. The tip is then inserted into a slot in a screw head. Then the rotatable portion is freed to rotate, causing all three portions to engage the walls of the slot.

The unit for engaging Phillips™ heads comprises two specially shaped prongs, spring loaded to separate. A sliding sleeve on the unit engages cams on the prongs to move their ends close enough together to be inserted into the characteristic cavity in a Phillips™ screw head. Pulling the sleeve off the cams allows the prongs to spread and be pressed against the walls of the cavity which they engage because of their unique conformation.

A third embodiment of the invention is based on a screw holding screwdriver marketed under the Craftsman™ name, Model No. 41463-WF.

Clips incorporating mechanism for gripping the walls of openings in screw heads have been found to be securely detachably attachable to such screw heads.

The invention is described in more detail below with reference to the attached drawings.

BRIEF DESCRIPTION OF THE DRAWINGS

FIG. 1 illustrates an embodiment of the subject invention incorporating mechanism of the Sears Craftsman™ D41024 screw starter.

FIG. 2 illustrates an embodiment of the subject invention incorporating mechanism of the Sears Craftsman™ 9 41025 screw starter.

FIG. 3 illustrates an embodiment of the subject invention adapted for use with a banana clip.

FIG. 4 illustrates a fourth embodiment of the invention based on Sears Craftsman™ screw driver model number 41463-WF.

DETAILED DESCRIPTION OF THE INVENTION

The subject invention is an electrical test clip temporarily attachable to screw heads having an opening having opposite facing walls, such as the walls of the slots in slotted head screws and the walls of the characteristic cavities of Phillips™ head screws. FIG. 1 illustrates an embodiment of the subject invention for use with slotted heads. Sleeve 10 is slidably and rotatably mounted on a reduced diameter portion 11 of shaft 12. Sleeve 10 is retained in place by pin 13 in cam slot 14 in the sleeve. Tongues 15 and 16 extend from end 17 of the sleeve and tongue 18 extends from the reduced diameter portion of the shaft. Spring means inside the mechanism spring load the sleeve to rotate on the shaft so that tongue 18 is out of coplanar configuration with tongues 15 and 16, the amount of rotation being determined by engagement of the pin in the slot. When the sleeve is rotated on the shaft against the spring load the tongues become aligned into a coplanar configuration and the sleeve can be moved linearly on the shaft so that the pin engages notch 19 in the slot so that the tongues are aligned but tongue 18 is withdrawn into the sleeve. When tongues 15 and 16 are inserted in a screw head slot and the engagement force moves the sleeve linearly to disengage the pin from the notch, tongue 18 also is inserted into the slot and the sleeve is actuated by the spring means so that the tongues all are pressed against the walls of the slot, securely disengageably engaging the screw head. This mechanism is adapted from Sears Craftsman™ screw starter, model number D41024. End 20 of conductor 21 is attached to the shaft by screw 22.

FIG. 2 illustrates an embodiment of the invention for use with Phillips™ head screws. Prongs 23 and 24 extend from shaft 25, are springy and in their free state extend away from each other, as shown. Sleeve 26 is installed on shaft 25 between shoulder 27 and the prongs. Cams 28 and 29 on prong 2 and 30 and 31 on prong 24 actuate the prongs toward each other when the sleeve is moved linearly over them. Ends 32 and 33 of the prongs can then be inserted in opposite grooves in the cavity of a Phillips™ head screw and, when the sleeve is moved back along the shaft, the spring action of the prongs forces their tips securely into the grooves to disengageably engage the tip assembly to the screw. End 34 of conductor 35 is attached to the shaft by screw 36. This mechanism is adapted from Sears Craftsman™ screw starter, model number 9 41025.

FIG. 3 illustrates the embodiment of FIG. 1 with conductor 37 attached to banana clip 38 and the clip inserted in hole 39 in the shaft.

The subject invention can also be embodied using the basic mechanical features of a specialized screw driver marketed by Sears Craftsman™, model number 41463-WF.

The screw engaging blade of this screw driver comprises two wedges such that when the edges of the blade are forced toward each other the two segments of the blade ride up on each other, increasing the effective thickness of the blade. A sleeve on the shank of the screw driver can be moved down the shank contacting the tapered edges of the blade and forcing them toward each other to increase the effective thickness of the blade to engage the slot in a slotted head. FIG. 4 illustrates this embodiment of the subject invention. Blade elements 40 and 41 extend from shaft 42. Sleeve 43 is movable along the shaft to engage cam areas 44 and 45 on the blade components, forcing them to ride up on each other on surfaces 46 and 47 thus increasing the effective width of the tip 48 of the clip and causing it to engage the walls of a slot in a screw head.

It is considered to be understood that in all embodiments appropriate insulation will be used, using materials and techniques well known in the art.

It is considered to be understandable from this description that the subject invention meets its objectives. It provides electrical test clips which are readily and securely temporarily attachable to slotted and Phillips™ head screws. The clips are easy to use and economical, partly because the basic mechanisms are in mass production for other purposes.

It is also considered to be understood that while certain embodiments of the subject invention are described herein, other embodiments are modifications of those described are possible within the scope of the invention which is limited only by the scope of the attached claims.

I claim:

1. An electrical test clip for use on screw heads having openings in the form of slots and cavities, said slots and cavities having walls, said electrical test clip comprising means for disengageably engaging said walls and means for actuating said means for disengagingly engaging said walls.

2. The test clips of claim 1 in which said means for disengageably engaging comprises first, second and third flat tongues, means for aligning said tongues in a coplanar configuration and locking said tongues in said coplanar configuration and means for unlocking and moving said second tongue out of said coplanar configuration, whereby with said first, second and third tongues in said coplanar configuration said tongues are insertable in said slot in said screw head and when said second tongue is moved out of said coplanar configuration by said means for unlocking and moving, said tongues engage said walls of said slot to detachably attach said clip to said screw head.

3. The test clip of claim 1 in which said means for disengageably engaging comprises first and second prongs having first and second ends, said clip further comprising means for moving said ends toward each other, said means for moving being moveable in a first direction to move said ends together whereby said ends fit in said cavity in said screw head and moveable in a second direction to allow said ends to move apart, whereby after said ends are inserted into said cavity and said means for moving is moved in said first direction said ends engage said walls of said cavity and detachably attach said clip to said screw head.

4. The test clip of claim 1 in which said means for disengageably engaging comprises a blade having an effective thickness and first and second elements having a first surface on said first element adjoining a second surface on said second element, said faces being configured such that moving said elements toward each other increases said effective thickness, said means further comprising means to move said elements toward each other, whereby with said tip inserted in said slot and said means operated to increase said effective thickness, said clip disengageably engages said walls of said slot in said screw head.

5. The clip of claim 1, adapted to accept a banana clip.
6. The clip of claim 2, adapted to accept a banana clip.
7. The clip of claim 3, adapted to accept a banana clip.
8. The clip of claim 4, adapted to accept a banana clip.
9. The clip of claim 5, adapted to accept a banana clip.

* * * * *